(12) United States Patent
Azdasht

(10) Patent No.: US 8,205,325 B2
(45) Date of Patent: Jun. 26, 2012

(54) DEVICE FOR APPLYING AN ELECTRONIC COMPONENT

(75) Inventor: Ghassem Azdasht, Berlin (DE)

(73) Assignee: Pac Tech—Packaging Technologies GmbH, Nauen (DE)

( * ) Notice: Subject to any disclaimer, the term of this patent is extended or adjusted under 35 U.S.C. 154(b) by 225 days.

(21) Appl. No.: 12/414,133

(22) Filed: Mar. 30, 2009

(65) Prior Publication Data

US 2009/0249620 A1   Oct. 8, 2009

(30) Foreign Application Priority Data

Apr. 2, 2008   (DE) .......................... 10 2008 017 180

(51) Int. Cl.
*B23P 19/00* (2006.01)
(52) U.S. Cl. ................. 29/743; 29/740; 29/741; 228/41; 228/5.5
(58) Field of Classification Search ............ 29/740–743, 29/729, 739, 840–842; 228/5.5, 41, 49.5; 219/121.63–121.68
See application file for complete search history.

(56) References Cited

U.S. PATENT DOCUMENTS

| | | | | |
|---|---|---|---|---|
| 3,887,783 A * | 6/1975 | Comette | .................... | 219/85.16 |
| 5,240,170 A * | 8/1993 | Nishida et al. | ........... | 228/180.21 |
| 5,977,512 A * | 11/1999 | Azdasht et al. | .......... | 219/121.63 |
| 6,915,940 B2 * | 7/2005 | Zakel et al. | ...................... | 228/41 |
| 2007/0257090 A1 * | 11/2007 | Azdasht et al. | ................ | 228/176 |
| 2008/0308536 A1 * | 12/2008 | Theppakuttai et al. | .. | 219/121.64 |
| 2009/0249620 A1 * | 10/2009 | Azdasht | .......................... | 29/834 |

* cited by examiner

Primary Examiner — Minh Trinh
(74) Attorney, Agent, or Firm — Fredrikson & Byron, P.A.

(57) ABSTRACT

The invention relates to a device for applying an electronic component having terminal faces, to a substrate, also having terminal faces, wherein the component is removed from a feeding device by means of an application device. An application device subsequently positions the component on the substrate in such a manner that the component terminal faces which extend from a contact side of the component up to a component rear side and the substrate terminal faces are in an overlapping position. A direct application of laser energy subsequently contacts the terminal faces to the component terminal faces. The application device has a contact nozzle with a component accommodating area for accommodating the component. The contact nozzle has a vacuum opening coupled to a vacuum duct and an emission opening for applying laser radiation to the component. The emission opening includes two emission windows which are spaced apart from one another by a component contact surface and each of the two emission windows is assigned to one of the terminal faces of the component. The component contact surface is formed by two front surfaces of two support bars which are arranged so as to be located opposite one another and which are embodied in the vacuum duct.

4 Claims, 5 Drawing Sheets

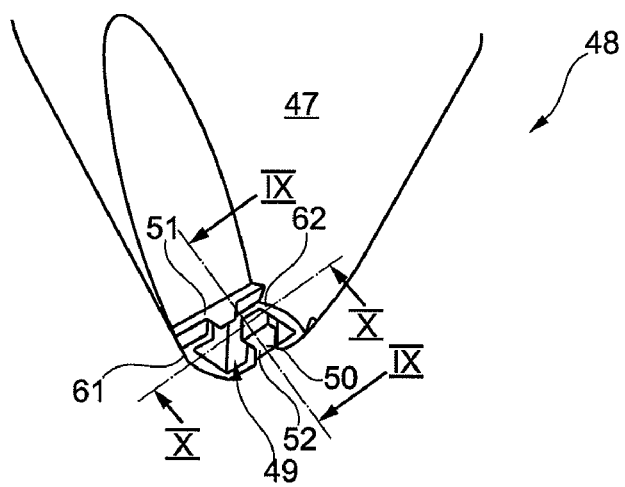
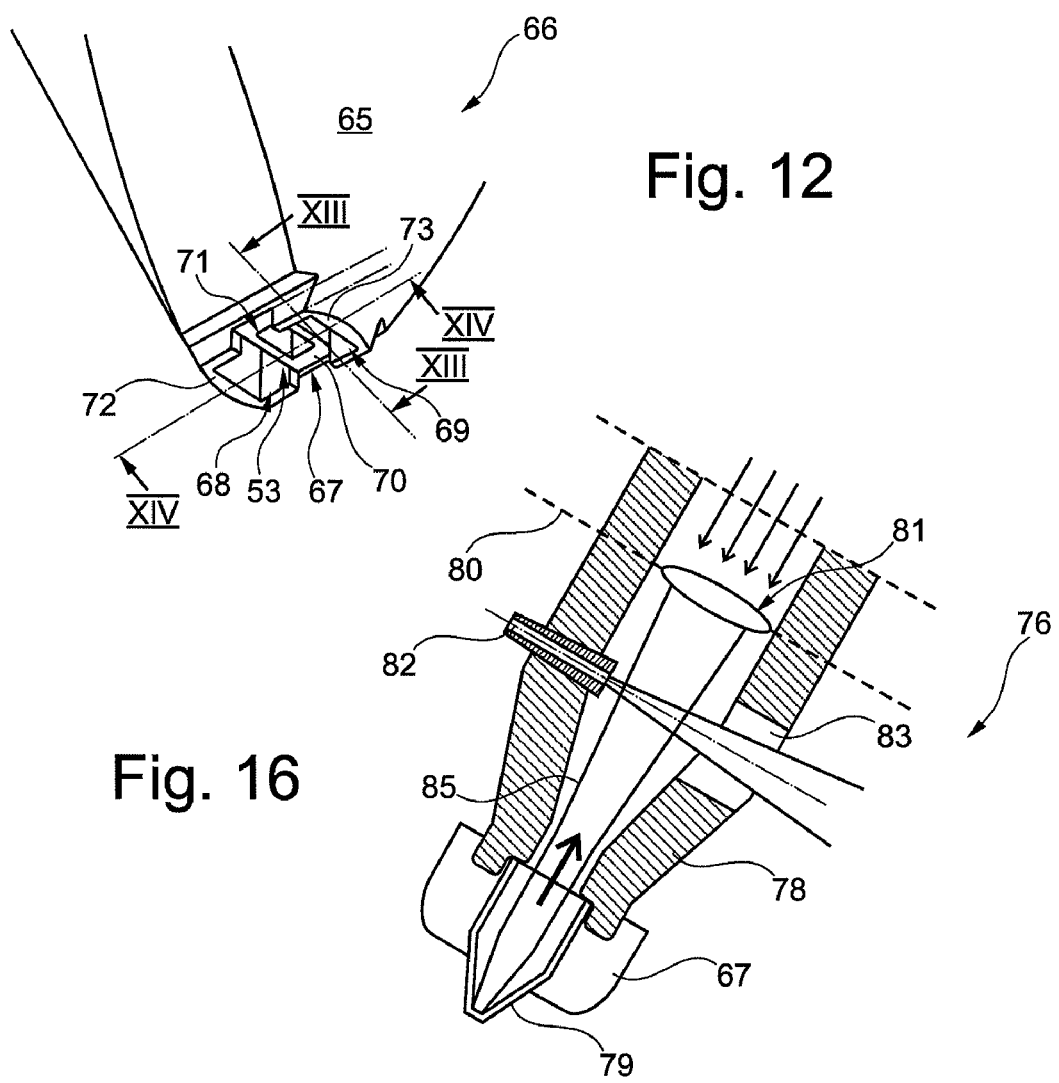

DEVICE FOR APPLYING AN ELECTRONIC COMPONENT

RELATED APPLICATIONS

This application claims priority to German Patent Application No. 10 2008 017 180.8 filed Apr. 2, 2008, the teachings of which are incorporated herein by reference.

The embodiments of the invention described hereinafter relate to methods for applying an electronic component, which is provided with terminal faces, to a substrate, which is also provided with terminal faces, wherein the component is removed from a feeding device by an application device and the component is subsequently positioned on the substrate by the application device in such a manner that the component terminal faces and the substrate terminal faces are in an overlapping position and the terminal faces are subsequently contacted by directly applying laser energy to the component terminal faces. The invention furthermore relates to application devices carrying out the methods according to the embodiments of the invention.

Methods for applying electronic components to substrates, where the component is contacted on the substrate after the component has been positioned, are well known. This includes, in particular, methods in which a contacting of chips on substrates is carried out with the use of the so-called "flip-chip" technology.

The so-called "flip-chip" technology involves a chip positioned relative to a substrate by an application device in such a manner that the terminal faces of the chip face the terminal faces of the substrate and are in an overlapping position with them. After positioning the chip, as a consequence of which a contact is established between the contacts of the chip and the contacts of the substrate, a rearward application of laser energy to the chip takes place so that the silicon body of the chip heats up and the thermal energy is transferred to the terminal faces by heat conduction through the silicon body of the chip.

Aside from the fact that such an indirect impingement of the terminal faces of the electronic component via the component body is only suitable for components which are embodied so as to be very thin, especially due to the thermal resistance which is to be overcome, the comparatively poor heat conductance characteristics of the body material as compared to the terminal faces leads to relatively long contacting times until the melting of the contact material applied to the connecting contacts, which is necessary for the contacting, has taken place.

For these reasons alone, the "flip-chip" or "facedown" contacting, which is known per se from the chip technology field and in which the chips are "flipped" onto the substrates with their terminal faces facing the substrate terminal faces, has up to now not been used for components other than chips, wherein the larger component dimensions surely played a role.

The embodiments of the invention are thus based on the object of proposing a method as well as a device, which provides for a type of contacting similar to the "flip-chip" technology for other electronic components as well.

On the one hand, a contacting of electronic components analogous to the "flip-chip" technology is also possible by means of directly applying laser energy to the component terminal faces, said components encompassing a considerably larger component mass than is the case with chips, without the heating of the component terminal faces, which is necessary for the contacting, requiring too much time. On the other hand, a contacting of electronic components is also possible analogous to the "flip-chip" technology irrespective of the heat conductance characteristics of the material of the components. With the use of the method according to the invention, for example, it is also possible to contact capacitor elements, which are largely formed from a dielectric which exhibits poor heat conductance characteristics as compared to the silicon which is used as material for a chip. By means of the methods according to the embodiments of the invention it is possible to directly apply the laser energy to the metallic capacitor plates separated by the dielectric, which is regularly formed from a ceramic material, respectively to the terminal faces embodied thereon, said laser energy causing a rapid heating of the capacitor plates, respectively of the terminal faces.

Due to the short heating time of the terminal faces according to the embodiments of the invention, laser energy can preferably already be applied to the component during the removal and/or the positioning of the component so as to carry out the contacting by means of melting of a solder material, which is built up on the component terminal faces and/or on the substrate terminal faces immediately after the positioning.

It proves to be particularly advantageous for the handling of the component, respectively the temporary holding of the component in the application device, when a vacuum is applied to the component during the removal and the positioning of the component.

When the application of laser energy to the component terminal faces coincides with the application of vacuum to the component at least in phases, it is possible to simultaneously use the vacuum application for dissipating volatile component parts of the terminal face material, thus for example evaporation components parts, which are released during the heating of the component terminal faces.

The methods according to the embodiments of the invention do not only provide for the contacting of electronic components on a substrate, but furthermore also provide for a removal of the component from the substrate in particular by applying a vacuum to the component and by simultaneously applying laser energy to the component terminal faces.

It hereby proves to be particularly advantageous when a torque is applied to the application device during the laser application, which mechanically supports the dissolving of the solder material connection to the substrate.

Depending on the characteristics of the component terminal faces, respectively of the terminal faces of the substrate, it can prove to be advantageous when prior to the positioning of the component on the substrate a solder material deposit is applied onto the terminal faces of the substrate by a solder material application device and is melted thereon.

The additional application of a solder material deposit onto the terminal faces of the substrate can be carried out without major effects on the time span required for carrying out the embodiments of the methods, when the solder material deposit is initially at least partially liquefied within the solder material application device by the solder material application device and when it is subsequently centrifuged against the terminal face of the substrate by the solder material application device by application of pressure.

According to the embodiments of the invention, a contact nozzle, which, in a component accommodating area for accommodating the component so as to ensure a position, encompasses a vacuum opening coupled to a vacuum duct for applying a vacuum to the component and an emission opening for applying laser radiation to the component. The emission opening preferably encompasses two emission windows which are spaced apart from one another by a component contact surface for supporting the component. Each of the two emission windows is assigned to a component terminal face.

It proves to be particularly advantageous when the emission windows are formed by partial areas of the vacuum opening so that not only the application of laser energy but also the application of vacuum to the component is possible via the emission windows.

According to a preferred embodiment, the component contact surface is formed by a front surface of a central support duct, which creates a broad support base for the component and which thus provides for a tilt-resistant support of the component.

According to a further embodiment, the component contact surface is formed by two front surfaces of two support bars, which are arranged so as to be located opposite one another and which are embodied in the vacuum duct, thus providing for the supporting function with a minimal effort.

It proves to be particularly advantageous when the emission windows are embodied so as to be larger than the component terminal faces, such that an emission gap is formed on the side of the component terminal faces in a component which is accommodated in the accommodating area. Laser energy can hereby be applied to the substrate terminal faces via the emission gap simultaneously with the application of laser energy to the component terminal faces after the positioning of the component on the substrate, given a correspondingly large-area embodiment of the substrate terminal faces.

When, according to an embodiment of the application device, the contact nozzle is embodied on an applicator body, which, in a wall delimiting a vacuum chamber underneath a lens device, is provided with a pressurized air feeding device extending at right angles to the longitudinal axis of the applicator body and with a pressured air dissipation device embodied opposite to the pressurized air feeding device, a dissipation of volatile component parts of the component contact surfaces, which are released during the laser application, can take place simultaneously with the build-up of the vacuum for holding the component in the contact nozzle by means of the cross flow in the nozzle, which generates the vacuum. In so doing, such volatile components can be prevented from depositing on the lens device, which serves the purpose of focusing the laser radiation onto the area of the emission windows.

Preferred embodiments of the invention will be defined in more detail below with respect to the drawing.

FIG. 8 shows a first embodiment of a contact nozzle of an application device in a perspective illustration;

FIG. 12 shows a further embodiment of a contact nozzle of an application device;

FIG. 16 shows a further embodiment of an application device.

Figure 1:
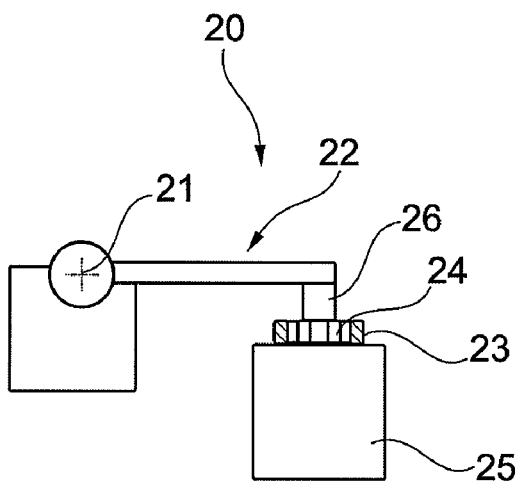
FIG. 1 shows a feeding device in an accommodating configuration.

FIG. 1 shows a feeding device which is embodied as a pivot feeder 20 and which encompasses an accommodating device 22, which can be pivoted about a pivot axis 21 and which serves the purpose of accommodating capacitors 24 arranged in a conveyor belt 23.

Figure 2:
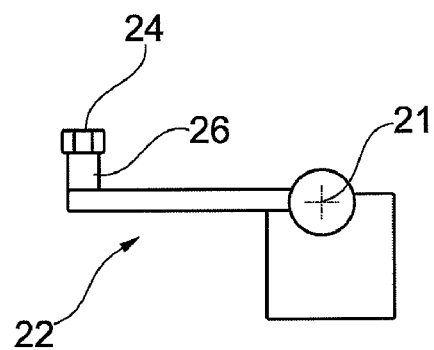
FIG. 2 shows the feeding device illustrated in FIG. 1 in a transfer configuration.

The conveyor belt 23 comprising the capacitors 24, which are connected therein via predetermined breaking points which are not illustrated in detail here, is moved forward by means of a belt conveying device 25 in a synchronized manner at right angles to the drawing plane. In the accommodating configuration illustrated in FIG. 1, the accommodating device 22 is pivoted against the capacitor 24 arranged in the accommodating position by means of an accommodating head 26, to which vacuum can be applied in the illustrated embodiment. The capacitor 24 is separated from the conveyor belt 23 and is transferred into the transfer position illustrated in FIG. 2 in an exposed manner by applying vacuum to the capacitor 24 while simultaneously carrying out a pivoting motion of the accommodating device 22 about the pivot axis 21.

Figure 3:
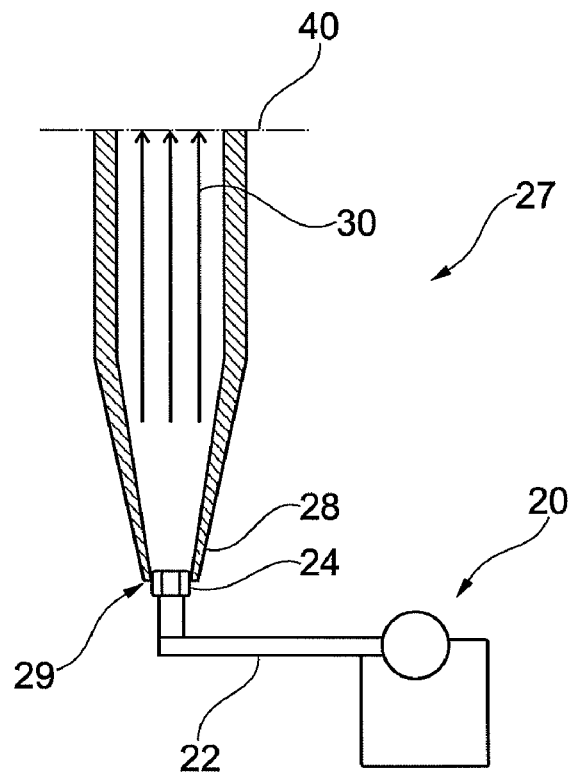
FIG. 3 shows an application device during the removal of a capacitor from the feeding device illustrated in FIG. 2.

FIG. 3 shows an application device 27 in its removal position, in which the application device 27 is positioned with its contact nozzle 28 above the capacitor 24 in such a manner that the capacitor 24 is arranged in an accommodating area 29, which is embodied in the contact nozzle 28.

In the removal position of the application device 27 illustrated in FIG. 3, a vacuum formed in a vacuum duct 30 of the contact nozzle 28 is applied to the capacitor 24 so that the capacitor 24 is removed from the pivot feeder 20 by means of the application device 27 and can be placed onto terminal faces 31, 32 of a substrate 33 in such a manner (FIG. 4) that terminal faces 34, 35 of the capacitor 24 are located at least in a contact area 36 of the terminal faces 34, 35 in an overlapping position with the terminal faces 31, 32 of the substrate 33.

Figure 4:
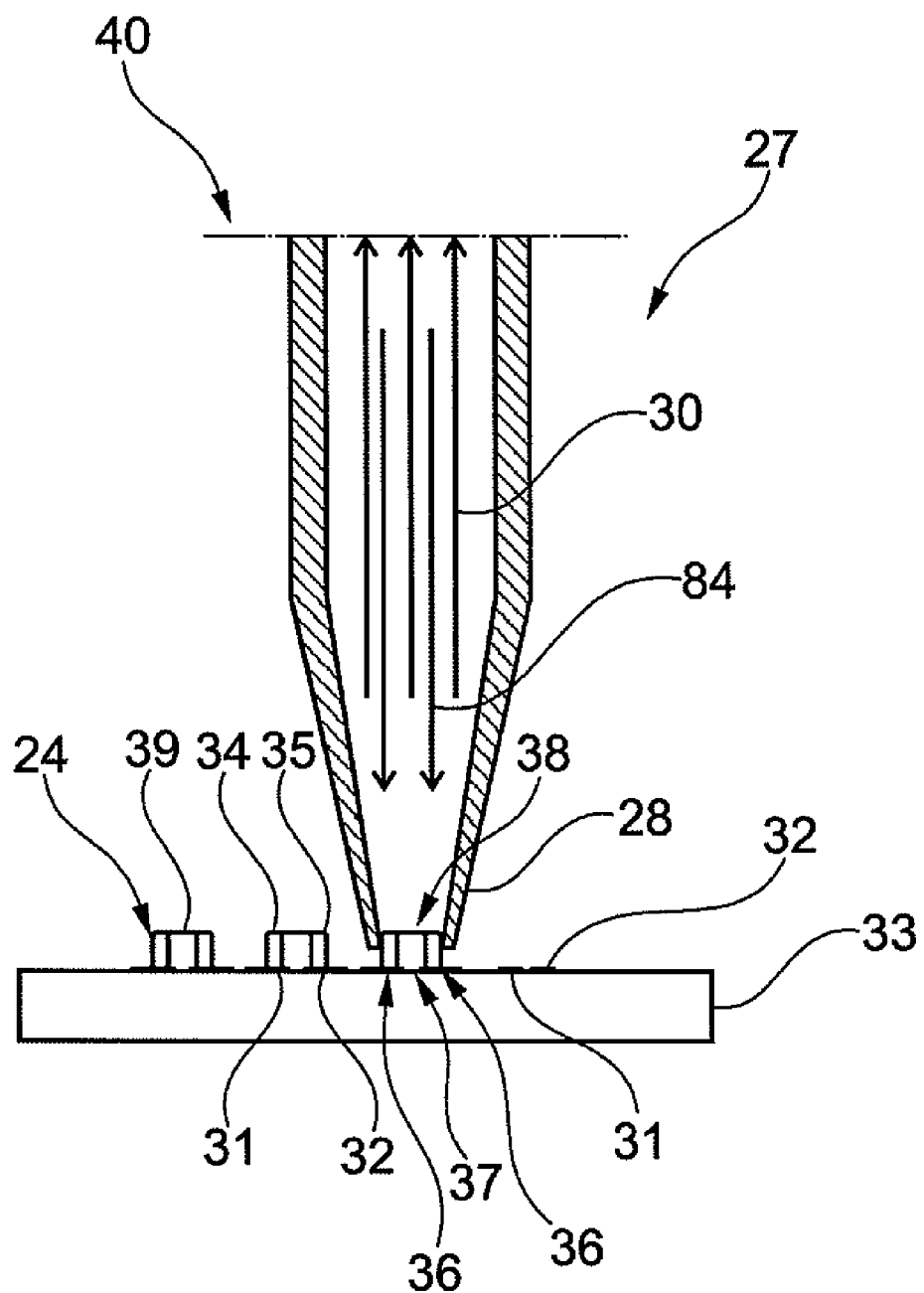
FIG. 4 shows the application device illustrated in FIG. 3 during the application of laser energy to the capacitor which is positioned on a substrate.

As can further be seen from FIG. 4, the terminal faces 34, 35 of the capacitor 24 extend up to a rear side 38, which is located opposite to a contact side 37 of the capacitor 24. In the contacting position of the application device 27 illustrated in FIG. 4, laser radiation 84 is applied directly to the terminal faces 34, 35 of the capacitor on the rear side 38 of the capacitor 24, so as to ensure a heat conduction up into the terminal faces 31, 32 of the substrate 33 via a corresponding direct heating of the terminal faces 34, 35. As is illustrated in FIG. 4, laser energy can also be applied to a ceramic dielectric 39, which is arranged between the terminal faces 34, 35, simultaneously with the direct application of laser energy to the terminal faces 34, 35 of the capacitor 24. Likewise, however, it is also possible to carry out a beam shaping or also a focusing of the laser radiation by means of a lens device (which is not illustrated here in detail), which is arranged in the application device 27 in a lens plane 40 in such a manner that laser energy is applied only to the terminal faces 34, 35 of the capacitor 24.

Figures 5, 6:
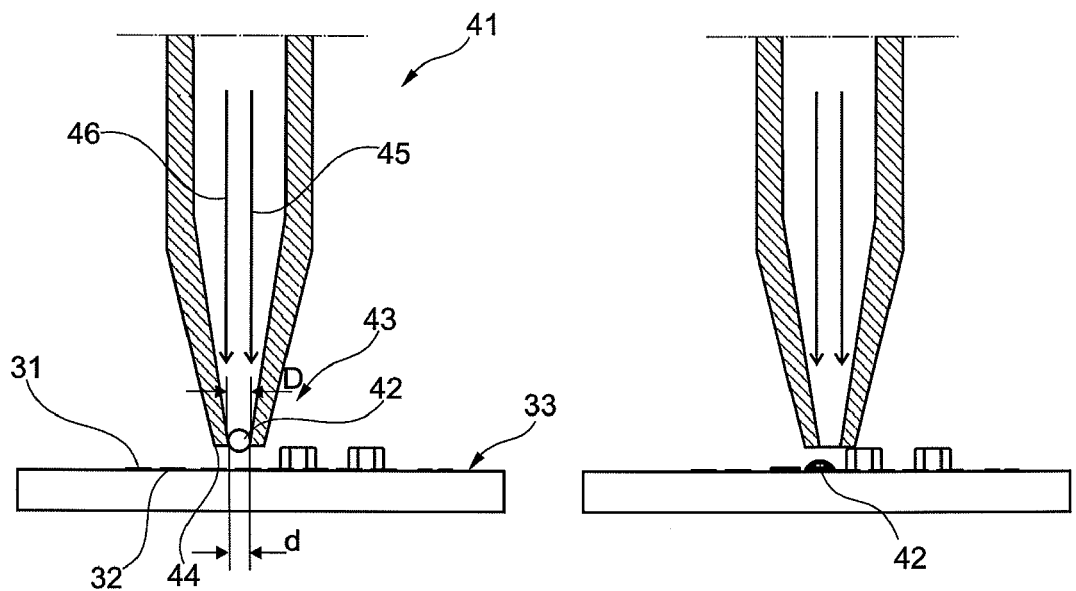
FIG. 5 shows a solder material application device in a positioning above a substrate terminal face.
FIG. 6 shows the solder material application device illustrated in FIG. 5 after the ejection of a solder material deposit onto the substrate terminal face.

An application of solder deposits 42 onto the terminal faces 31, 32 of the substrate 33, which is carried out by means of a solder material application device 41 and which can be carried out prior to the positioning and the contacting of the capacitors 24 by means of the application device 27, is illustrated in FIGS. 5 and 6. This optional solder material application, which can be carried out additionally, if applicable, can be carried out in particular when the terminal faces 31, 32 of the substrate 33 are only insufficiently metallized for a direct contacting with the terminal faces 34, 35 of the capacitor. The solder material application device 41 encompasses an ejection nozzle 43 comprising an ejection opening 44, the diameter D of which is dimensioned to be smaller than the diameter d of a solder material deposit 42, which is embodied as a solid state body. Based on the ejection position of the solder material application device 41 illustrated in FIG. 5, where the ejection nozzle 43 is located above a selected terminal face 31, 32 of the substrate 33, at least partial melting of the solder material deposit 42 with a simultaneous pressurization 46 is carried out by means of a rearward application of laser energy 45 to the solder material deposit 42 in such a manner that the at least partially melted solder material deposit 42 is centrifuged against the terminal face 31, 32 of the substrate 33 and is arranged thereon, as is illustrated in FIG. 6. So as to attain a complete wetting of the terminal face 31, 32 of the substrate 33 with the solder material deposit 42, if applicable, the laser energy application 45 can subsequently still be maintained over a certain period.

Figure 7:
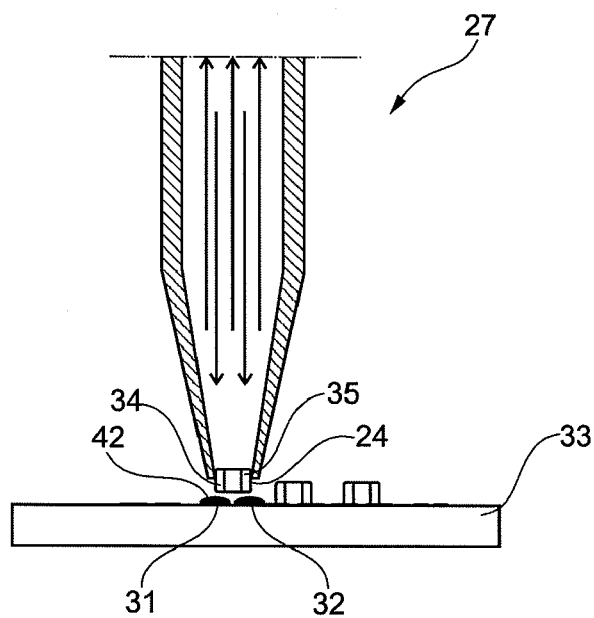
FIG. 7 shows the application device during the positioning of a capacitor onto substrate terminal faces which are provided with solder material deposits.
Figure 13:
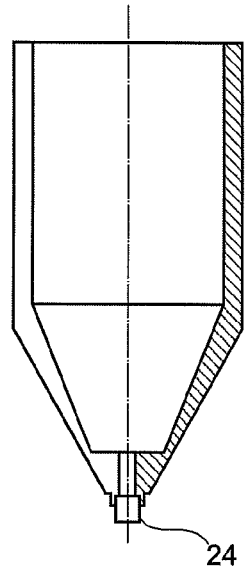
FIG. 13 shows a longitudinal sectional illustration of the contact nozzle illustrated in FIG. 12 along the course of the intersecting line XIII-XIII in FIG. 12.
Figure 14:
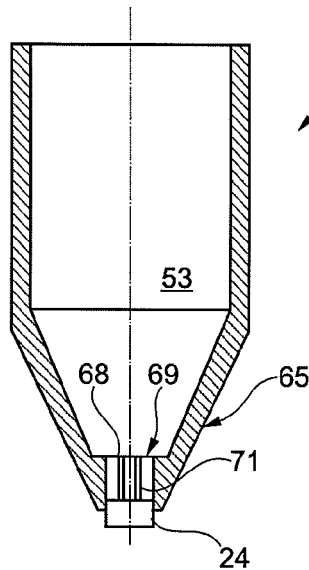
FIG. 14 shows a longitudinal sectional illustration of the contact nozzle illustrated in FIG. 12 along the course of the intersecting line XIV-XIV in FIG. 12.

FIG. 7 shows subsequent positioning of the capacitor 24 on the terminal faces 31, 32 of the substrate 33, which are provided with the solder material deposits 42, by means of the application device 27. The contacting of the capacitor 24 with the substrate 33 can then subsequently take place analogous to the phase of carrying out the method as illustrated in FIG. 4 by establishing a solder material connection between the terminal faces 34, 35 of the capacitor 24 and the terminal faces 31, 32 of the substrate 33.

Figure 9:
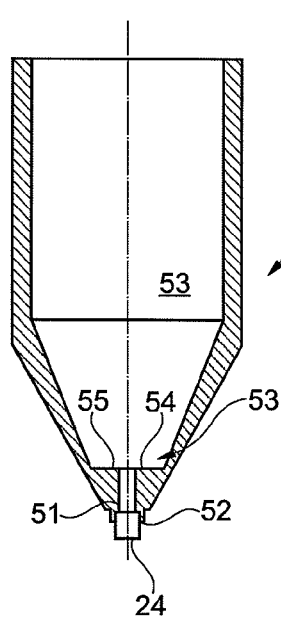
FIG. 9 shows a longitudinal sectional illustration of the contact nozzle illustrated in FIG. 8 along the course of the intersecting line IX-IX in FIG. 8.
Figures 10, 11:
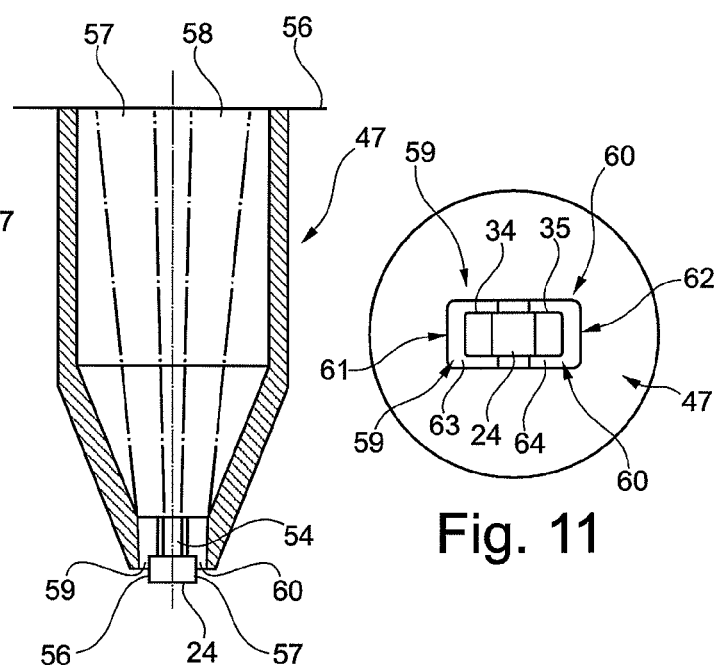
FIG. 10 shows a longitudinal sectional illustration of the contact nozzle illustrated in FIG. 8 along the course of the intersecting line X-X in FIG. 8.
FIG. 11 shows a bottom view of the contact nozzle illustrated in FIG. 8 comprising a capacitor accommodated therein.

FIG. 8 shows a contact nozzle 47 of an application device 48, which encompasses an accommodating area 49 which is delimited on the rear side by a terminal face 50 defined by front surfaces 51, 52 of support bars 54, 55 arranged opposite one another in a vacuum duct 53, as can be seen in particular from a supplementary synopsis of FIGS. 9 and 10. In the contact nozzle 47, respectively in the vacuum duct 53, two emission windows 59, 60 are arranged spaced apart from one another by means of the support bars 54, 55, wherein a first and second partial laser radiation 57, 58, which is aligned by means of a lens device being arranged in a lens plane 56 and not illustrated here in detail, is emitted from the contact nozzle 47 through said emission windows 59, 60. The outer delimitation of the emission windows 59, 60 takes place herein via U-shaped edge connecting elements 61, 62 at the contact nozzle 47 (FIG. 8).

In a bottom view of the contact nozzle 47, FIG. 11 shows emission gaps 63, 64, which are embodied in the area of the emission windows 59, 60 between the edge connecting elements 61, 62 and the capacitor 24 and the dimensions of which determine the size of the radiation portions which escape from the contact nozzle 47 past the terminal faces 34, 35 of the capacitor 24 so as to enable a direct application of laser radiation to terminal faces 31, 32 of the substrate 33 (FIG. 4) in addition to the direct application of laser energy to the terminal faces 34, 35 of the capacitor 24, if applicable.

FIGS. 12 to 15 illustrate a contact nozzle 65 of an application device 66, which differs from the contact nozzle 47 illustrated in FIGS. 8 to 11 by a changed embodiment of a terminal face 67 on the one hand as well as by emission windows 68 and 69, which are embodied differently on the other hand.

The terminal face 67 of the contact nozzle 65 is defined by a frame-like front surface 70 of a support duct 71 embodied in the vacuum duct 53. The frame-like front surface 70 provides for a comparatively wider support base for supporting the capacitor 24 on the terminal face 67.

Figure 15:
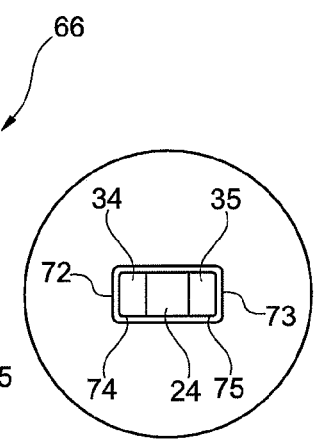
FIG. 15 shows a bottom view of the contact nozzle illustrated in FIG. 12 comprising a capacitor accommodated therein.

As is shown in FIG. 15, edge connecting elements 72, 73 of the contact nozzle 65, which are arranged at a slight distance from one another, lead to emission gaps 74, 75, which are embodied so as to be relatively small.

In a further embodiment, FIG. 16 shows an application device 76 comprising a contact nozzle 79, which is fastened to an applicator body 78 by means of a connecting nut 67 so as to be detachable and thus replaceable. To generate a vacuum in a vacuum chamber 85 between the contact nozzle 79 and a lens device 81 arranged in a lens plane 80, provision is made in the wall of the applicator body 78, at right angles to the longitudinal axis of the application device 76, respectively to the optical axis of the lens device 81, for a pressurized air feeding device 82 and a pressurized air dissipation device 83 being arranged in diametrically opposite direction thereto. The embodiment of the pressurized air feeding device 82 and of the pressurized air dissipation device 83 in the applicator body 78 provides for a pressurized air cross flow in the vacuum chamber 85 of the application device 76, which ensures the embodiment of the desired vacuum on the one hand and the dissipation from the vacuum chamber 85 of volatile component parts escaping from the solder material during a contacting of the capacitor 24 on the other hand. These volatile component parts can thus not lead to a deposit on the lens device 81 and thus to an impairment of the emission power of the application device.

The methods described above may also be used to remove a component from a substrate by applying vacuum to the component and simultaneously applying laser energy to the component terminal faces. In one embodiment, torque may be applied to the application device during the laser application to the component terminal faces which mechanically supports the dissolving of the solder material connection to the substrate.

The invention claimed is:

1. An application device for applying an electronic component which is provided with terminal faces to a substrate which is provided with terminal faces, wherein the terminal faces on the component extend from a contact side to a rear side, opposite the contact side, the device comprising:

a contact nozzle having a component accommodating area for accommodating the component so as to ensure a position, a vacuum opening coupled to a vacuum duct for applying vacuum to the component and an emission opening for applying laser radiation to the component, wherein the emission opening includes two emission windows which are spaced apart from one another by a component contact surface for supporting the component, and each of the two emission windows is assigned to one of the terminal faces of the component, wherein the component contact surface is formed by two front surfaces of two support bars which are arranged so as to be located opposite one another and which are embodied in the vacuum duct.

2. The application device according to claim 1, wherein the emission windows are formed by partial areas of the vacuum opening.

3. The application device according to one of claim 1, wherein the emission windows are larger than the component terminal faces so that an emission gap is formed on the side of the component terminal faces.

4. The application device according to claim 1, wherein the contact nozzle is located on an applicator body which has a longitudinal axis, the contact nozzle further comprising a pressurized air feeding device located under a lens in the vacuum chamber and extending at right angles to the longitudinal axis of the applicator body and with a pressurized air dissipation device located opposite to said pressurized air feeding device.

* * * * *